(12) United States Patent
Sonoda

(10) Patent No.: US 9,263,323 B2
(45) Date of Patent: Feb. 16, 2016

(54) SEMICONDUCTOR DEVICE HAVING PARALLEL CONDUCTIVE LINES INCLUDING A CUT PORTION AND METHOD OF MANUFACTURING THE SAME

(71) Applicant: KABUSHIKI KAISHA TOSHIBA, Tokyo (JP)

(72) Inventor: Masahisa Sonoda, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/194,433

(22) Filed: Feb. 28, 2014

(65) Prior Publication Data

US 2014/0346677 A1    Nov. 27, 2014

(30) Foreign Application Priority Data

May 21, 2013 (JP) ................................. 2013-107051

(51) Int. Cl.
*H01L 23/498* (2006.01)
*H01L 21/768* (2006.01)
*H01L 21/033* (2006.01)
*H01L 21/311* (2006.01)
*H01L 23/528* (2006.01)

(52) U.S. Cl.
CPC ...... *H01L 21/76838* (2013.01); *H01L 21/0337* (2013.01); *H01L 21/31144* (2013.01); *H01L 21/76816* (2013.01); *H01L 23/528* (2013.01); *H01L 2924/0002* (2013.01)

(58) Field of Classification Search
CPC ................ H01L 23/498; H01L 21/768; H01L 21/76838; H01L 23/49827; H01L 27/10; H01L 21/88; H01L 29/78; H01L 21/027; H01L 21/3205; H01L 32/336; H01L 21/522; H01L 27/115; H01L 29/788; H01L 29/792
USPC ............. 257/774, 773, 775, 776, 4, 369, 618, 257/368, 203, 208, 207, 211; 438/667
See application file for complete search history.

(56) References Cited

U.S. PATENT DOCUMENTS

| 5,617,340 | A | * | 4/1997 | Cresswell et al. ............... 702/85 |
| 8,281,262 | B2 | * | 10/2012 | Aton ................................ 716/50 |
| 2007/0285983 | A1 | * | 12/2007 | Ishii et al. ................. 365/185.13 |
| 2011/0215442 | A1 | * | 9/2011 | Shneyder et al. ............. 257/621 |
| 2012/0045901 | A1 | * | 2/2012 | Kim et al. ...................... 438/703 |
| 2012/0120706 | A1 | * | 5/2012 | Ohgami ........................... 365/72 |
| 2012/0211836 | A1 | * | 8/2012 | Takeuchi ....................... 257/368 |
| 2012/0219914 | A1 | * | 8/2012 | Muraki ......................... 430/296 |
| 2013/0250676 | A1 | * | 9/2013 | Hishida et al. ............. 365/185.2 |
| 2013/0277823 | A1 | * | 10/2013 | Ogisu et al. ................... 257/734 |
| 2014/0183702 | A1 | * | 7/2014 | Kodama et al. ............... 257/618 |
| 2014/0209849 | A1 | * | 7/2014 | Okajima ........................... 257/4 |
| 2015/0021782 | A1 | * | 1/2015 | Kodama et al. ............... 257/773 |

FOREIGN PATENT DOCUMENTS

JP    2008-177483 A  *  7/2008
JP    2012-099627 A     5/2012

* cited by examiner

*Primary Examiner* — Alexander Oscar Williams
(74) *Attorney, Agent, or Firm* — Patterson & Sheridan, LLP

(57) ABSTRACT

A semiconductor device includes a plurality of parallel conductive lines that are spaced apart from one another in a first direction and extend in a second direction transverse to the first direction. The parallel conductive lines includes first and second lines that are adjacent, and a third line that is adjacent to the second line, and the first and third lines each have a cut portion at different points along the second direction.

13 Claims, 16 Drawing Sheets

SEMICONDUCTOR DEVICE HAVING PARALLEL CONDUCTIVE LINES INCLUDING A CUT PORTION AND METHOD OF MANUFACTURING THE SAME

CROSS-REFERENCE TO RELATED APPLICATION

This application is based upon and claims the benefit of priority from Japanese Patent Application No. 2013-107051, filed May 21, 2013, the entire contents of which are incorporated herein by reference.

FIELD

Embodiments described herein relate generally to a semiconductor device and a method of manufacturing the same.

BACKGROUND

A process of manufacturing a semiconductor device, may employ a sidewall transfer technique that uses a sidewall formed around a mandrel as a pattern, as a method of forming a fine pattern that challenges the limits of the optical lithography. Recent processes have employed this technique twice in order to form a further finer wiring pattern.

To form a wiring pattern, a cut pattern in which a part of a line and space pattern is cut, is formed. If the above-mentioned sidewall transfer technique is used, the number of wirings formed in a loop shape around the mandrel of the cut pattern portion is increased and therefore, the area of the portion to be cut is increased.

DETAILED DESCRIPTION

In general, embodiments provide a semiconductor device including a pattern capable of preventing an increase in chip area.

According to an embodiment, a semiconductor device includes a wiring pattern that includes a plurality of parallel conductive lines that are spaced apart from one another in a first direction and extend in a second direction transverse to the first direction. The parallel conductive lines include first and second lines that are adjacent, and a third line that is adjacent to the second line, and first and third lines each have a cut portion at different points along the second direction.

Hereinafter, a plurality of embodiments in which the disclosure is applied to a NAND type flash memory will be described with reference to the drawings. Here, the drawings are schematically shown and do not always conform to the actual size such as a relation between thickness and plane measurements and a ratio of thickness of each layer. The vertical and horizontal directions do not necessarily conform to directions defined with respect to the direction of gravitational acceleration but are defined with respective to a circuit-formed surface of a semiconductor substrate described later as upper surface.

First Embodiment

Figure 1:
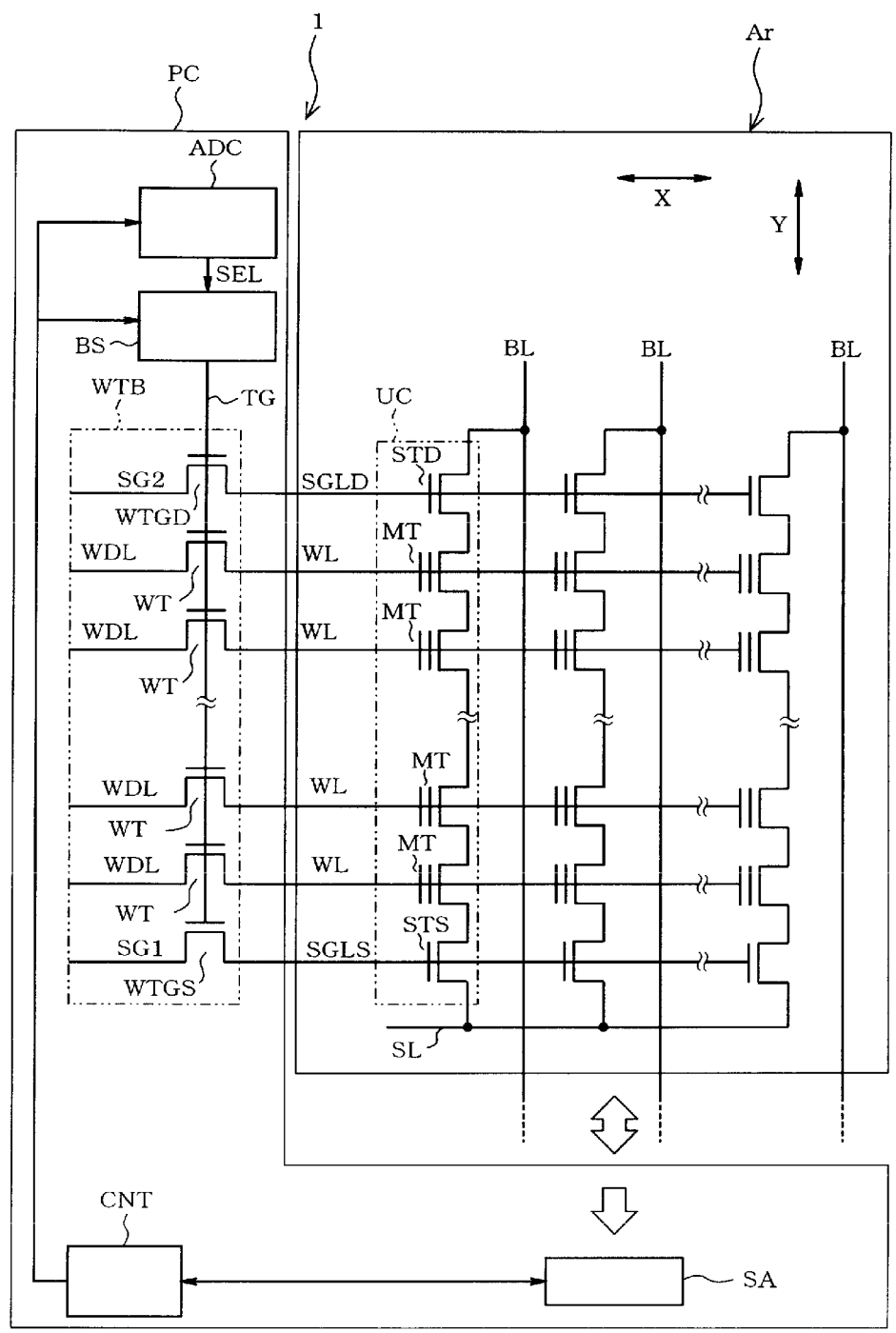
FIG. 1 is an exemplary view schematically showing an electrical structure of a memory cell region and a peripheral circuit region of a NAND type flash memory according to a first embodiment.

FIGS. 1 to 12A and 12B depict a first embodiment. FIG. 1 is an example schematically showing the electrical structure of the NAND type flash memory in a block diagram. As illustrated in FIG. 1, a NAND type flash memory 1 includes a memory cell array Ar with many memory cells arranged in a matrix shape, a peripheral circuit PC for performing reading/writing/erasing of each memory cell in the memory cell array Ar, and an input and output interface (not illustrated).

A plurality of cell units UC are arranged in the memory cell array Ar within a memory cell region. The cell unit UC includes a select gate transistor STD connected to the side of a bit line BL, a select gate transistor STS connected to the side of a source line SL, and the k-th power of 2 of (for example, 32 (=m)) memory cell transistors MT connected in series between the two select gate transistors STD and STS.

One block includes n cell units UC arranged in parallel in the X direction (in the direction of column: in the horizontal direction in FIG. 1). The memory cell array Ar is formed by arranging the blocks in the Y direction (in the direction of row: in the vertical direction in FIG. 1). To simplify the description, FIG. 1 shows one block.

The peripheral circuit region is arranged around the memory cell region and the peripheral circuit PC is arranged around the memory cell array Ar. This peripheral circuit PC includes a controller CNT, an address decoder ADC, a sense amplifier SA, a booster circuit BS including a charge pump circuit, and a transfer transistor WTB. The address decoder ADC is electrically connected to the transfer transistor WTB through the booster circuit BS.

The controller CNT controls the address decoder ADC, the sense amplifier SA, the booster circuit BS including the charge pump circuit, and the transfer transistor WTB according to a command from the outside. The address decoder ADC selects one block in response to an address signal given from the outside. The booster circuit BS boosts a drive voltage supplied externally upon receipt of the select signal of a block, and supplies a predetermined voltage to the respective transfer gate transistors WTGD, WTGS, and WT through a transfer gate line TG.

The transfer transistor WTB includes a transfer gate transistor WTGD, a transfer gate transistor WTGS, and a word line transfer gate transistor WT. The transfer transistor WTB is provided for every block.

One of the drain and the source of the transfer gate transistor WTGD is connected to the select gate driver line SG2 and the other is connected to the select gate line SGLD. One of the drain and the source of the transfer gate transistor WTGS is connected to the select gate driver line SG1 and the other is connected to the select gate line SGLS. Further, one of the drain and the source of each transfer gate transistor WT is connected to a corresponding word line driving signal line WDL and the other is connected to a corresponding word line WL formed within the memory cell array Ar.

In the plural cell units UC arranged in the X direction, the gate electrodes SG of the respective select gate transistors STD are electrically connected through a select gate line SGLD. Similarly, the gate electrodes SG of the respective select gate transistor STS are electrically connected through the select gate line SGLS. The sources of the select gate transistors STS are commonly connected to the source line SL. The respective gate electrodes MG of the respective memory cell transistors MT in every cell unit UC arranged in the X direction are electrically connected through the respective word lines WL.

The gate electrodes of the respective transfer gate transistors WTGD, WTGS, and WT are mutually connected in common by the transfer gate line TG and connected to a boosted voltage supply terminal of the booster circuit BS.

Figure 2A:
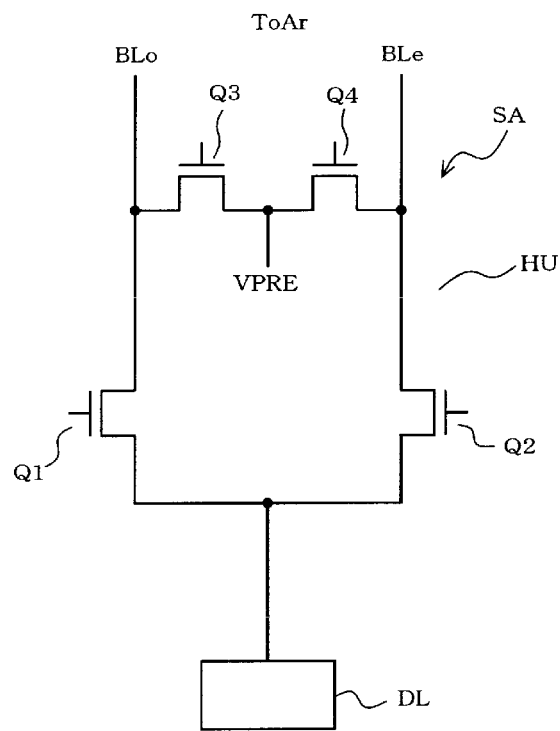
FIG. 2A is an exemplary view of an electrical structure of an example of a bit line hookup circuit.

As illustrated in FIG. 2A, the sense amplifier SA includes a bit line hookup circuit HU connected to every two adjacent bit lines in bit lines of the memory cell region and a data latch circuit DL. The bit line hookup circuit HU includes a transistor Q1 for connecting a bit line BLo of odd number to the data latch circuit DL and a transistor Q2 for connecting a bit line BLe of even number to the data latch circuit DL. The bit line hookup circuit HU further includes a transistor Q3 for connecting the bit line BLo of odd number to a control line VPRE and a transistor Q4 for connecting the bit line BLe of even number to the control line VPRE.

Figure 2B:
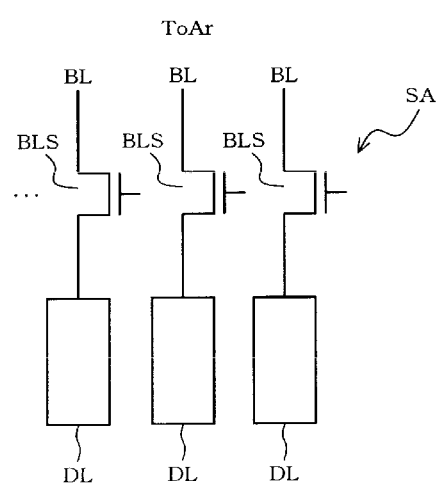
FIG. 2B is an exemplary view of an electrical structure of another example of a bit line hookup circuit.

Alternatively, in some cases, each sense amplifier SA is connected to each of the bit lines BL of the memory cell array Ar, as illustrated in FIG. 2B. Here, each of the bit lines BL is connected to each data latch circuit DL through a corresponding bit line select transistor BLS.

Figure 3:
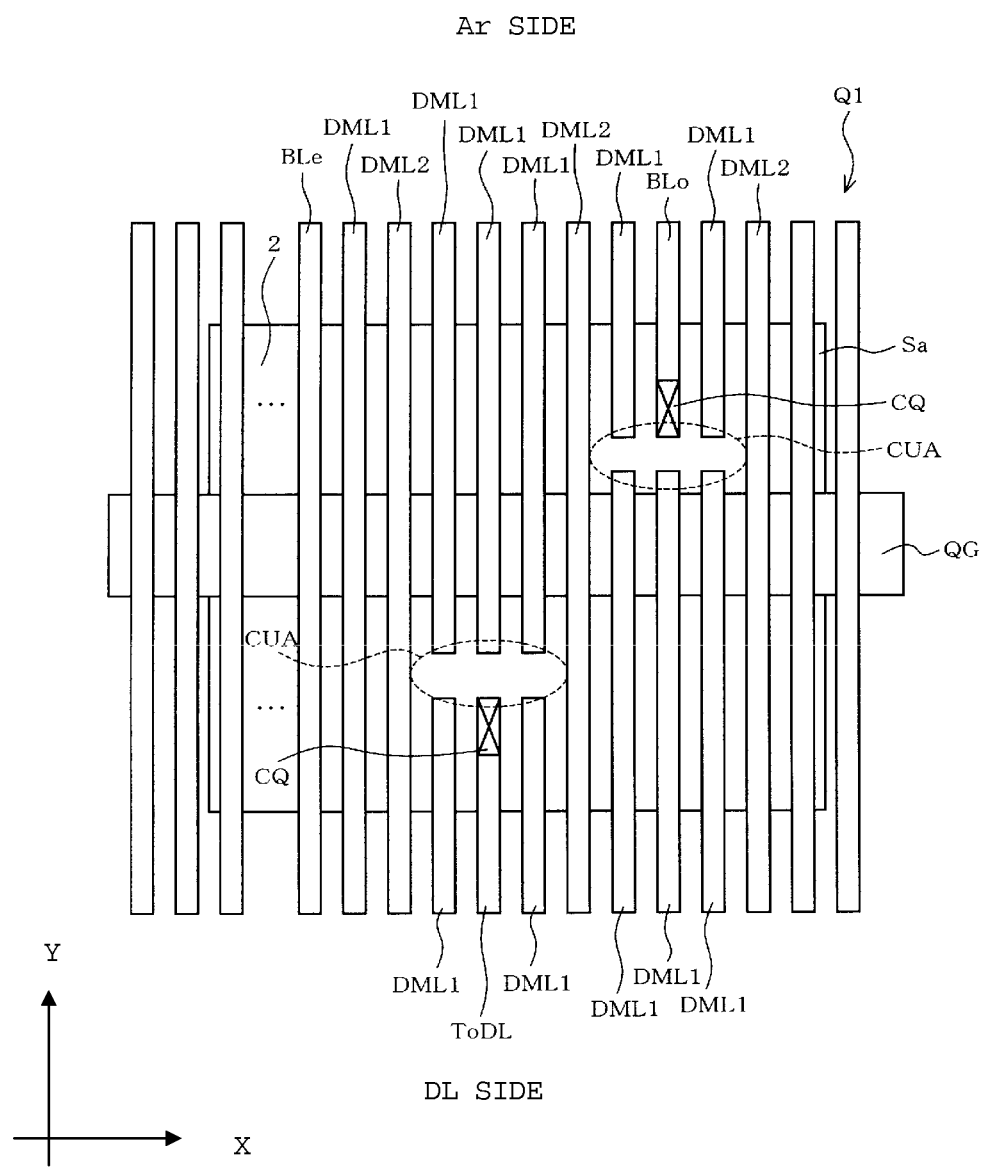
FIG. 3 is an exemplary plan view showing cut areas of wirings in a bit line hookup circuit.

FIG. 3 shows one example of a layout of the portion of the transistor Q1 of the bit line hookup circuit HU or the transistor BLS. Hereinafter, the description will be made using the transistor Q1 as an example. The transistor Q1 is provided with an element forming area Sa formed in a rectangular shape on a silicon substrate 2 that is a semiconductor substrate and a gate electrode QG formed across the middle portion of the element forming area Sa. An interlayer insulating film is formed above the upper layer of the element forming area Sa and the gate electrode QG, and a plurality of (for example, 32) wirings are arranged on the interlayer insulating film, and across and above the gate electrode QG. The bit lines BLo and BLe are included in the wirings; for example, these lines can be embedded in concave portions formed in the interlayer insulating film as a copper wiring pattern according to the Damascene technique.

The bit lines BLo and BLe are alternately arranged within the memory cell array Ar shown in FIG. 1. In the sense amplifier SA, however, the wirings are formed with at least three dummy lines DML in an electrically floating state that are arranged between the bit lines BLo and BLe. By arranging the dummy lines DML between the bit lines BLo and BLe, a dielectric breakdown voltage between the bit line BLo and the bit line BLe is improved. The bit line BLo and a wiring ToDL that extends to the data latch circuit DL are respectively connected to the source and the drain region of the transistor Q1 through the contacts CQ.

Each of the bit line BLo and the wiring ToDL connected to the transistor Q1 has a cut area CUA for three wirings including itself and adjacent dummy lines DML positioned on the both sides thereof. This cut area CUA is formed by cutting a set of three wirings including the bit line BLo and the adjacent dummy lines DML on both sides thereof or the wiring ToDL and the adjacent dummy lines DML on both sides thereof. The cut areas CUA are adjacently arranged at a predetermined distance in the bit line direction in a state where each set of three wirings has been cut. As a result, the dummy lines DML2 are not cut and extend in the bit line direction between the adjacent cut areas CUA.

Further, the dummy line DML1 on the nearer side of the memory cell array Ar than the cut area CUA can be used as a routing wiring that is on the nearer side of the memory cell array Ar than the transistor Q1. Further, the dummy line DML2 arranged between the cut areas CUA may be connected to the gate electrode of the transistor Q1. As a result, the dummy line DML2 can be used as a signal line for turning on and off the transistor Q1. Further, the dummy line DML2 may be also used as a shield wiring by connecting it to a ground voltage. Furthermore, the dummy line DML2 may be in a floating state.

The transistor Q2 is positioned on the side of the data latch circuit DL of the transistor Q1 (lower portion in FIG. 2A). The bit line BLe has the same cut area CUA in the transistor Q2 as the bit line BLo.

The above cut area CUA in which a set of the three lines including the bit line BLo, BLe, or wiring ToDL together with the two adjacent dummy lines DML is cut, is formed in a pattern where a part of a bit line pattern formed according to a line and space pattern, is previously cut, in the wiring process. In this case, during pattern formation of the bit lines BLo, BLe, and wiring ToDL, a pattern formed by the lithography is subjected to the sidewall transfer technique twice, hence to form a fine pattern. Therefore, in the case of forming a cut pattern according to the comparative method, when embedded wirings are formed through the Damascene process, a cut area of seven lines including the bit line BLo, BLe, or wiring ToDL and three dummy lines DML on both sides thereof is formed.

In this embodiment, even if the formation of a wiring pattern using the sidewall transfer technique twice is adopted, there is provided a manufacturing method capable of forming a cut area CUA in a three-cut pattern. Hereinafter, the manufacturing process will be described with reference to FIGS. 4 to 12.

Figure 4A:
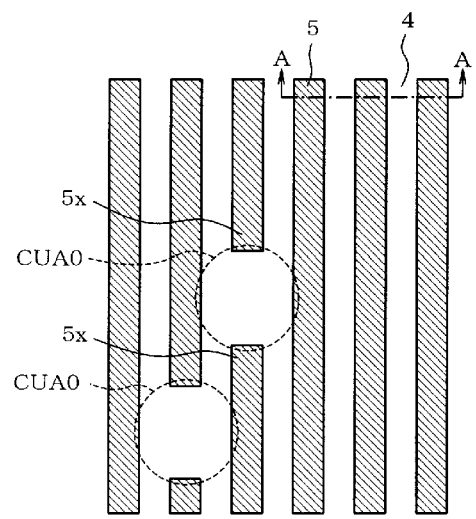
FIG. 4A is an exemplary plan view of the cut areas of wirings in the bit line hookup circuit illustrating one step of manufacturing process.
Figure 4B:
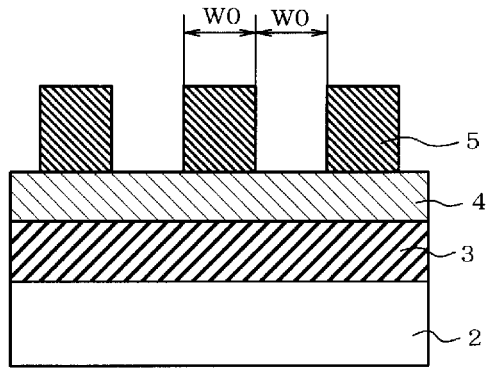
FIG. 4B is an exemplary cross-sectional view of the portion indicated by a line A-A in FIG. 4A (example 1).

FIGS. 4A and 4B show a state in which an interlayer insulating film 3 formed of, for example, a silicon oxide film, and a lower layer film 4 for forming a wiring pattern are formed on the silicon substrate 2 in which memory cell transistors and other elements are formed through the element forming process, and then, a first upper layer film pattern 5 (mandrel pattern 5) is formed on the top surface. The lower layer film 4 is formed of a material different from that of the interlayer insulating film 3 and can be selectively etched. The upper layer film of the first upper layer film pattern 5 is made of such a material that the above film can be selectively etched on the lower layer film 4.

FIG. 4A shows an example of a plane pattern, and the first upper layer film pattern 5 is a pattern in which the upper layer film is processed according to a line and space pattern in a bit line forming direction. The first upper layer film pattern 5 contains a cut pattern 5x cut corresponding to a portion where the cut area CUA (shown in FIG. 3) is formed. FIG. 4A shows the cut pattern 5x corresponding to the two cut areas CUA shown in FIG. 3. The cut areas CUA0 are formed by the cut pattern 5x. The cut area CUA0 has a wider area than the cut area CUA. FIG. 4B schematically shows the cross-section of a portion indicated by the line A-A in FIG. 4A. In the following FIGS. 5 to 12, B of each figure indicates the cross-section cut along the same portion shown in FIG. 4A, and the description is not repeated due to limitation of space.

In the above structure, the first upper layer film pattern 5 is formed with the same size W0 in the width and the space, and this is regarded as the size of the possible limit or size near the limit by, for example, the lithography technique. Alternatively, the width of W0 may be set at a predetermined width regardless of the limit of the optical lithography.

Figure 5A:
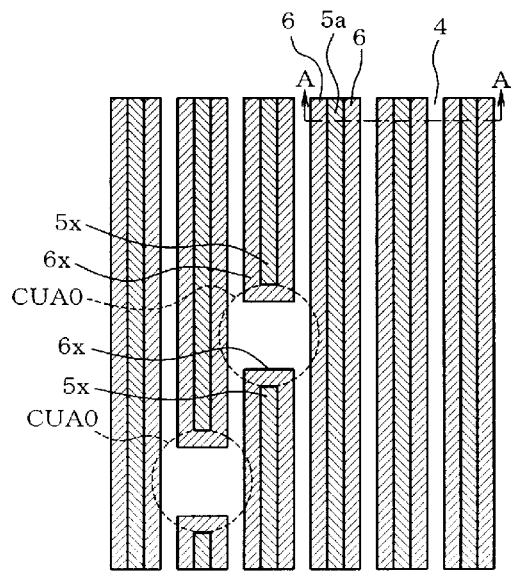
FIG. 5A is an exemplary plan view of the cut areas of wirings in the bit line hookup circuit illustrating one step of the manufacturing process.
Figure 5B:
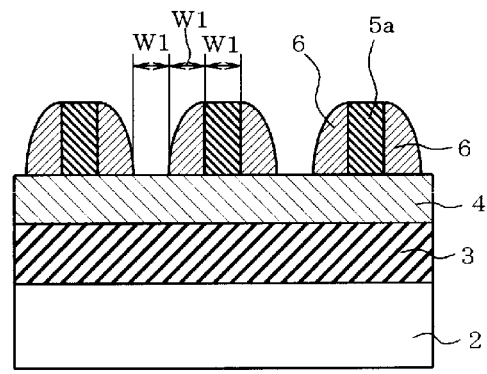
FIG. 5B is an exemplary cross-sectional view of the portion indicated by the line A-A in FIG. 5A (example 2).

Next, as illustrated in FIGS. 5A and 5B, the width W0 of the first upper layer film pattern 5 may be about a half width W1 (=W0/2) by slimming processing, hence to form a second upper layer film pattern 5a. According to the slimming processing, the pitch of the second upper layer film pattern 5a becomes about three times of the width W1. Thereafter, first sidewall films 6 with the film thickness of W1 are formed on the both sidewalls of the second upper layer film pattern 5a. According to this, the second upper layer film pattern 5a and the first sidewall film 6 are respectively formed with the width of W1, and the space between the first sidewall films 6 also becomes W1.

The first sidewall film 6 is formed of a material different from, for example, the lower layer film 4 and the second upper layer film pattern 5a and the material that can be selectively etched is selected. For example, when the lower layer film 4 is a silicon nitride film and the second upper layer film pattern 5a is a silicon film, a silicon oxide film can be used as the first sidewall film 6. Alternatively, these materials can be exchanged and used for the above films in a different combination.

The first sidewall film 6 is made by forming a film for forming a sidewall with a film thickness of W1 on the whole surface after the second upper layer film pattern 5a is formed. In this case, since the pitch of the second upper layer film pattern 5a is about three times of W1, when a film for sidewall is formed along the top surface and the sidewall of the second upper layer film pattern 5a, the width of the concave portion becomes W1. Thereafter, the film for sidewall is etched back according to the reactive ion etching (RIE), to remove the portion formed on the top surface of the second upper layer film pattern 5a and the top surface of the lower layer film 4. According to this, the first sidewall films 6 are formed on the both sidewalls of the second upper layer film pattern 5a in a spacer shape.

Further, in this state, since the first sidewall films 6 are formed to surround the second upper layer film pattern 5a, the first sidewall film 6 in the cut area CUA0 of FIG. 5A is formed to surround the cut pattern 5x where the second upper layer film pattern 5a is cut, hence to form a loop first sidewall film 6x connected in a loop shape.

Figure 6A:
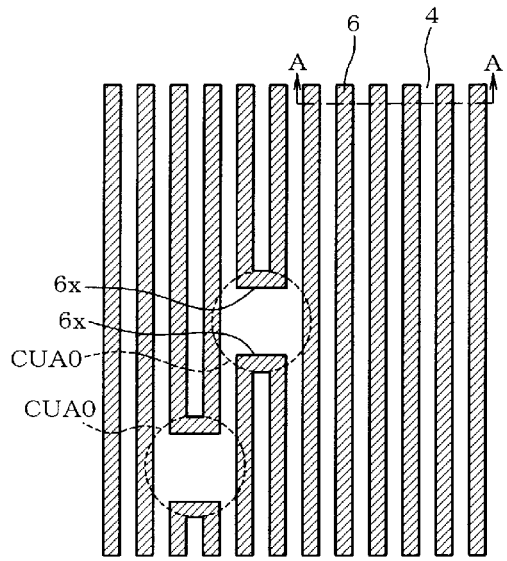
FIG. 6A is an exemplary plan view of the cut areas of wirings in the bit line hookup circuit illustrating one step of the manufacturing process.
Figure 6B:
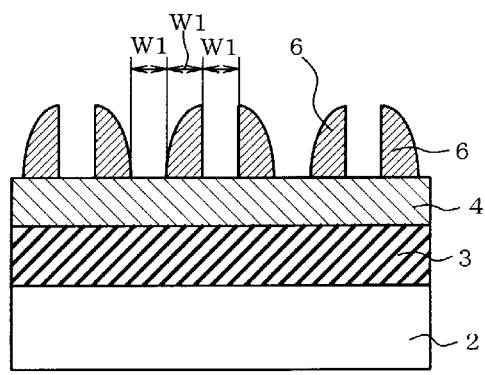
FIG. 6B is an exemplary cross-sectional view of the portion indicated by the line A-A in FIG. 6A (example 3).

Next, as illustrated in FIGS. 6A and 6B, the above is formed into a pattern in which the second upper layer film pattern 5a is selectively removed and the first sidewall films 6 are left on the lower layer film 4. The second upper layer film pattern 5a is removed selectively according to the processing of dry etching or wet etching. According to this, the first sidewall films 6 with the width of W1 are formed into a state of being aligned at the pitch of W1 on the lower layer film 4, that is, into a line and space pattern.

Figure 7A:
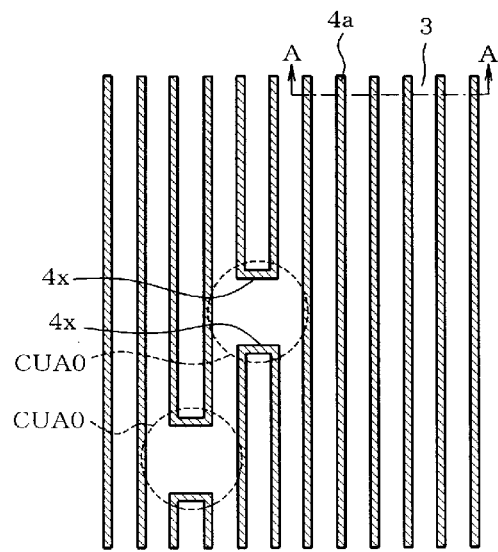
FIG. 7A is an exemplary plan view of the cut areas of wirings in the bit line hookup circuit illustrating one step of the manufacturing process.
Figure 7B:
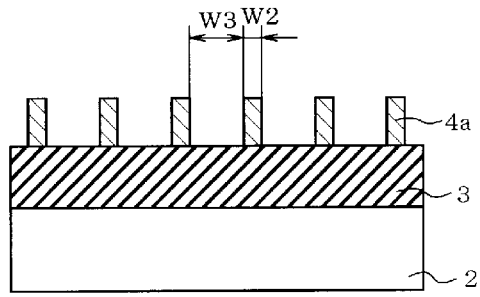
FIG. 7B is an exemplary cross-sectional view of the portion indicated by the line A-A in FIG. 7A (example 4).

Next, as illustrated in FIGS. 7A and 7B, the first sidewall films 6 are used to etch the lower layer film 4, hence to form a first lower layer film pattern. In this case, after the lower layer film 4 is etched, the first sidewall films 6 are removed, and the film 4 is formed a second lower layer film pattern 4a with a width of W2 (=W1/2=W0/4) by the slimming process. Here, since the width W2 of the second lower layer film pattern 4a is about half of the width W1 of the first sidewall film 6, the pitch W3 of the second lower layer film pattern 4a becomes about three times of the width W2 of the second lower layer film pattern 4a.

Further, in this state, since the second lower layer film pattern 4a is formed in the same pattern as that of the first sidewall film 6, a loop pattern 4x connected in a loop shape is formed in the cut area CUA0 of FIG. 7A, similarly to the loop first sidewall film 6x.

Figure 8A:
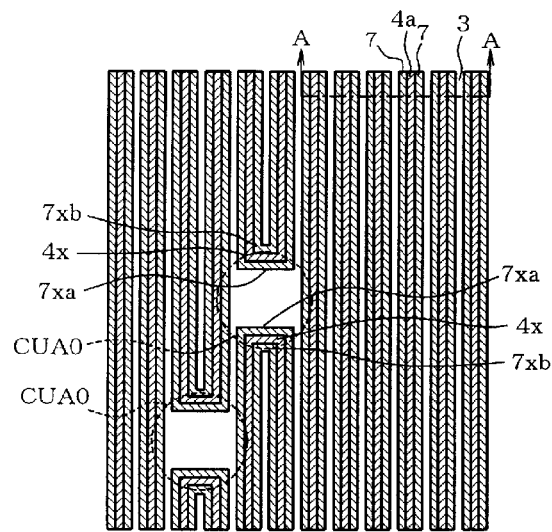
FIG. 8A is an exemplary plan view of the cut areas of wirings in the bit line hookup circuit illustrating one step of the manufacturing process.
Figure 8B:
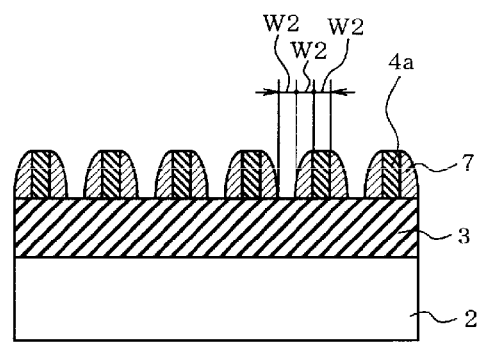
FIG. 8B is an exemplary cross-sectional view of the portion indicated by the line A-A in FIG. 8A (example 5).

Next, as illustrated in FIGS. 8A and 8B, second sidewall films 7 with the width of W2 are formed on the both sidewalls of the second lower layer film pattern 4a. According to this, the second lower layer film pattern 4a and the second sidewall film 7 are respectively formed with the width of W2 and the space between the second sidewall films 7 also becomes W2.

The second sidewall film 7 is formed of a material different from that of the interlayer insulating film 3 and the second lower layer film pattern 4a and the material that can be selectively etched is selected. For example, when the interlayer insulating film 3 is a silicon oxide film and the second lower layer film pattern 4a is a silicon nitride film, a silicon film such as polycrystalline silicon film can be used as the second sidewall film 6. Alternatively, these materials can be exchanged and used for the above films in a different combination.

The second sidewall film 7 is made by forming the film for forming a sidewall film on the whole surface with a film thickness of W2 after the second lower layer film pattern 4a is formed. In this case, since the pitch of the second lower layer film pattern 4a is about three times of W2, when the film for sidewall is formed along the top surface and the sidewalls of the second lower layer film pattern 4a, the width of the portion where the interlayer insulating film 3 is exposed becomes W2. Thereafter, the film for forming a sidewall film is etched according to the reactive ion etching (RIE), and the top surface of the second lower layer film pattern 4a and the top surface of the interlayer insulating film 3 are removed. According to this, the second sidewall films 7 are formed on the both sidewalls of the second lower layer film pattern 4a in a spacer shape.

Further, in this state, since the second sidewall films 7 are formed in a way of surrounding the second lower layer film pattern 4a, the second sidewall film 7 in the cut area CUA0 of FIG. 8A is formed along the loop pattern 4x of the second lower layer film pattern 4a, hence to form an outer loop second sidewall film 7xa and an inner loop second sidewall film 7xb each connected in a loop shape.

Figure 9A:
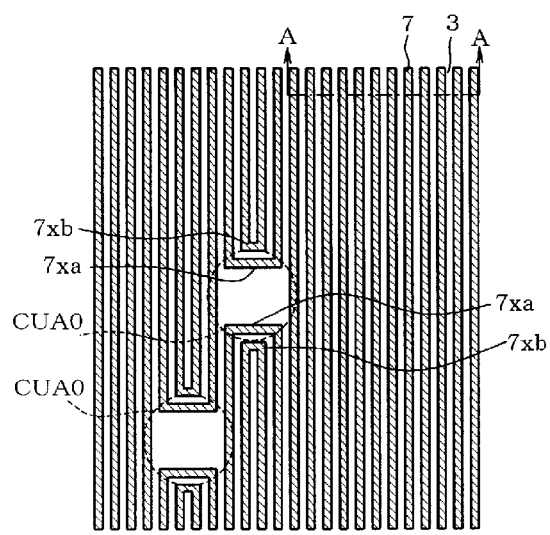
FIG. 9A is an exemplary plan view of the cut areas of wirings in the bit line hookup circuit illustrating one step of the manufacturing process.
Figure 9B:
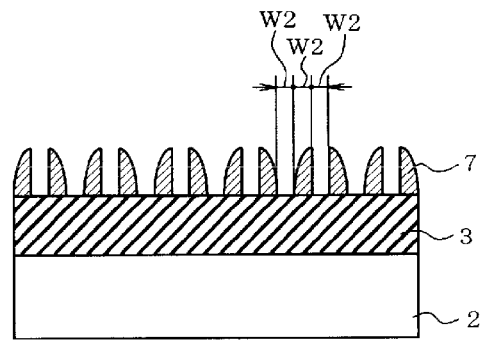
FIG. 9B is an exemplary cross-sectional view of the portion indicated by the line A-A in FIG. 9A (example 6).

Then, as illustrated in FIGS. 9A and 9B, the above is formed into a pattern in which the second lower layer film pattern 4a is selectively removed and the second sidewall films 7 are left on the interlayer insulating film 3. The second lower layer film pattern 4a is removed selectively according to the processing of dry etching or wet etching. According to this, the second sidewall films 7 with the width of W2 are formed into a state of being aligned on the interlayer insulating film 3 at the pitch of W2, that is, into a line and space pattern.

Figure 10A:
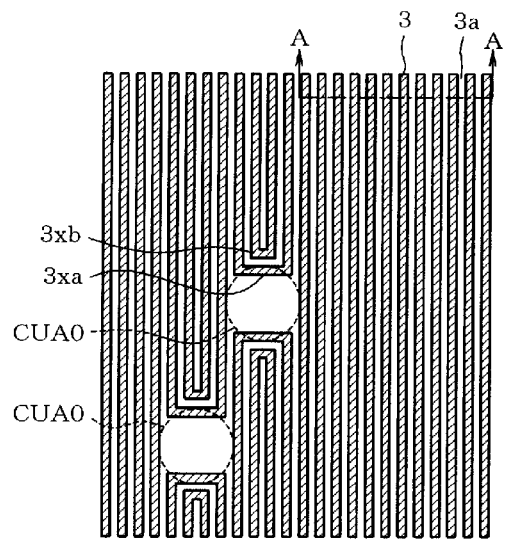
FIG. 10A is an exemplary plan view of the cut areas of wirings in the bit line hookup circuit illustrating one step of the manufacturing process.
Figure 10B:
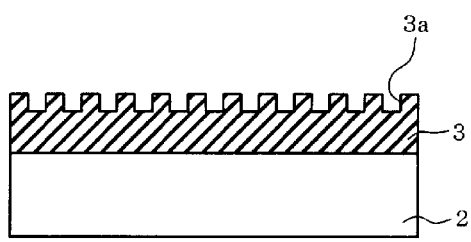
FIG. 10B is an exemplary cross-sectional view of the portion indicated by the line A-A in FIG. 10A (example 7).

Subsequently, as illustrated in FIGS. 10A and 10B, the surface layer of the interlayer insulating film 3 is etched using the second sidewall films 7 as a mask, to form concave portions 3a with a predetermined depth on the top surface of the interlayer insulating film 3. In this state, since the concave portion 3a is formed at a portion where the second sidewall film 7 is not formed, a loop concave portion 3xa and one inner cut pattern concave portion 3xb are formed in a different region from the loop second sidewall films 7xa and 7xb of the second sidewall film 7, in the cut area CUA0 of FIG. 10A. Further, a wide portion of the cut area CUA0 is formed as a connected concave portion 3xc.

Figure 11A:
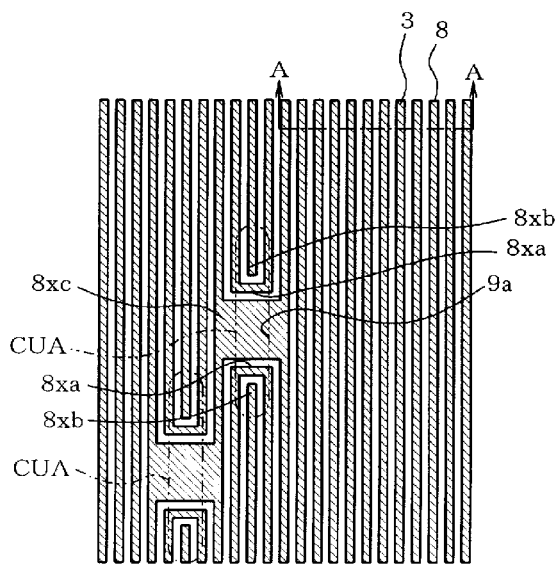
FIG. 11A is an exemplary plan view of the cut areas of wirings in the bit line hookup circuit illustrating one step of the manufacturing process.
Figure 11B:
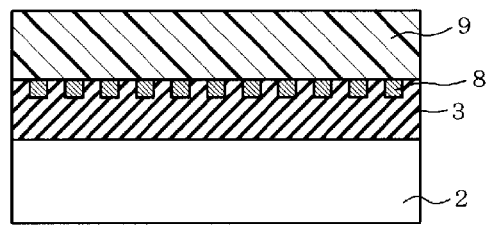
FIG. 11B is an exemplary cross-sectional view of the portion indicated by the line A-A in FIG. 11A (example 8).

Next, as illustrated in FIGS. 11A and 11B, the concave portions 3a of the interlayer insulating film 3 formed as mentioned above are filled with a wiring pattern 8 of copper according to a so-called Damascene process. In this case, at first, a wiring film of copper is formed on the interlayer insulating film 3 that has the above concave portions 3a formed thereon. According to this, a copper wiring film is formed on the interlayer insulating film 3 and in the concave portions 3a. Thereafter, the copper wiring film only within the concave portions 3a is left and the other copper wiring film on the interlayer insulating film 3 is removed according to polishing processing by the chemical mechanical polishing (CMP).

Since the wiring pattern 8 is formed within the concave portions 3a of the interlayer insulating film 3, an outer loop wiring pattern 8xa formed within the outer loop concave portion 3xa and a cut wiring pattern 8xb formed within the inner cut pattern concave portion 3xb are formed in the cut area CUA0 of FIG. 11A. Further, a connected wiring pattern 8xc is formed also in the wide connected concave portion 3xc and the pattern is formed in a state of connecting two wiring patterns 8.

In the state where the above wiring pattern 8 is formed, a resist film 9 for forming a cut area is formed on the top surface. According to the photolithography technique, an opening 9a of the cut area CUA is patterned correspondingly to the cut area CUA0.

Figure 12A:
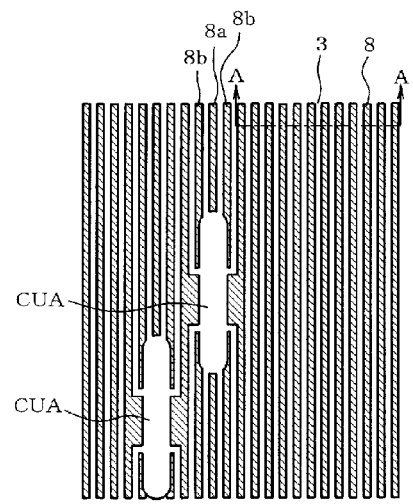
FIG. 12A is an exemplary plan view of the cut areas of wirings in the bit line hookup circuit illustrating one step of the manufacturing process.
Figure 12B:
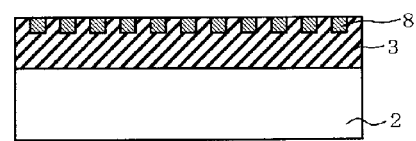
FIG. 12B is an exemplary cross-sectional view of the portion indicated by the line A-A in FIG. 12A (example 9).

Subsequently, as illustrated in FIGS. 12A and 12B, the loop wiring pattern 8xa and the connected wiring pattern 8xc of the wiring pattern 8 exposed to the opening 9a of the resist 9 are removed. At a time of removing the above wiring, a part of the distal end of the cut wiring pattern 8xb may be removed. According to this, three adjacent wiring patterns 8 are formed to be cut in the cut area CUA. In this case, the wiring pattern 8 in the middle of the three copper wiring patterns 8 is regarded as the bit line BLo, BLe, or wiring ToDL, and the adjacent copper wiring patterns 8 on both sides thereof are the dummy lines DML. Further, at least a part of the loop wiring pattern 8xa extending in the X direction crossing the Y direction may be cut off. As a result, an adjustment margin in the X direction can be increased.

The cut areas CUA where the three wiring patterns 8 are cut off are sequentially formed at a position with one wiring pattern 8 intervening therebetween in the direction crossing the extending direction of the wiring pattern 8 and at a position deviated in the extending direction of the wiring pattern 8. This makes it possible to form the wiring pattern of the bit line hookup circuit HU of the structure shown in FIG. 3.

According to the first embodiment as mentioned above, when the sidewall transfer technique is used twice to embed and form the wiring pattern 8 in the interlayer insulating film 3, the cut area CUA in the bit line hookup circuit HU can be formed by cutting off the three adjacent wiring patterns 8, thereby saving the space.

Further, the bit line BLo and the wiring ToDL connected to the transistor Q1 are cut by the different cut areas CUA0 and CUA1. As a result, a possibility of shorting the bit line BLo and the wiring ToDL can be reduced.

Second Embodiment

FIGS. 13A to 13D depict a second embodiment and a description will be made about the portions different from the first embodiment.

In the embodiment, the cut pattern 5x is not formed at the same time as the line and space pattern by the patterning according to the lithography technique but formed in a different process, when forming the first upper layer film pattern 5 shown in FIGS. 4A and 4B in the first embodiment.

Figure 13A:
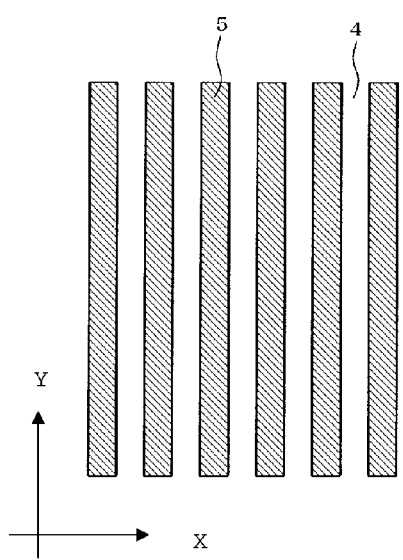
FIGS. 13A to 13D are each an exemplary plan view of the cut areas of wirings in the bit line hookup circuit corresponding to each step in the manufacturing process according to a second embodiment.

Namely, as illustrated in FIG. 13A, the interlayer insulating film 3 and the lower layer film 4 for forming a wiring pattern are formed above the silicon substrate 2 and on the top surface thereof, the first upper layer film pattern 5 in which the upper layer film is processed into a line and space pattern, is formed. The first upper layer film pattern 5 is formed by the line and space pattern in the direction of forming the bit line according to the lithography technique. The first upper layer film pattern 5 is formed with the same size W0 in the width and the space, and this is regarded as the size of the possible limit or size near the limit of, for example, the optical lithography.

Figure 13B:
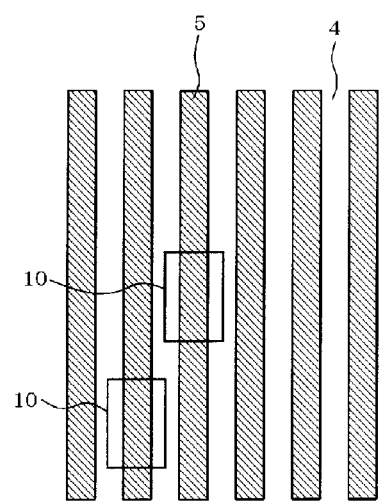
Figure 13C:
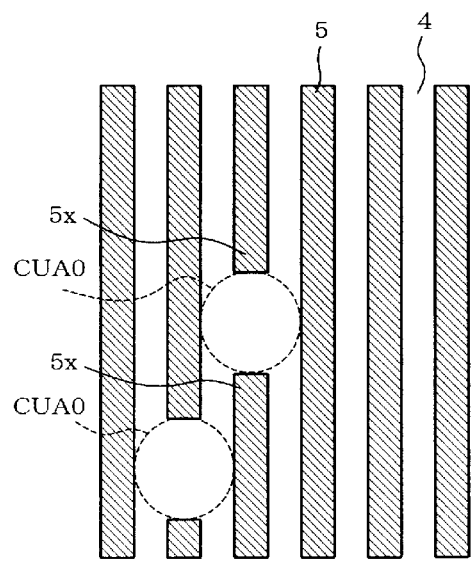

Next, as illustrated in FIG. 13B, the photolithography processing is performed in order to partially remove the first upper layer film pattern 5. Here, the openings 10 are formed in a resist pattern and the first upper layer film pattern 5 exposed to the openings 10 is cut off by RIE. FIG. 13C shows the first upper layer film pattern 5 and the portion about the cut pattern 5x obtained through the above processing, and the cut areas CUA0 are provided in the portions by the cut pattern 5x.

Figure 13D:
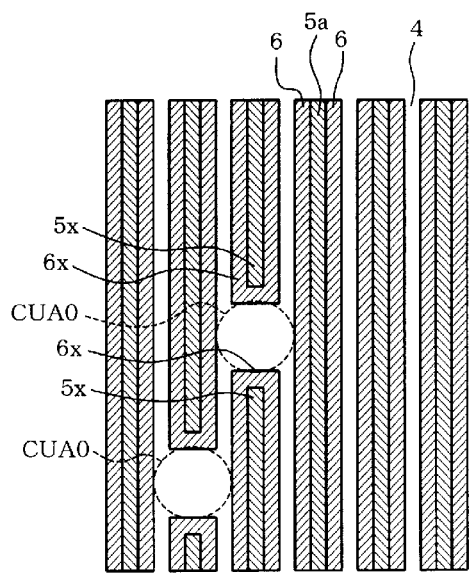

Next, as illustrated in FIG. 13D, the first upper layer film pattern 5 and the cut pattern 5x are used as the mandrel, to perform the slimming processing similarly to the first embodiment, to form the second upper layer film pattern 5a and to form the first sidewall film 6 passing through the process of sidewall film formation. Hereinafter, by carrying out the similar process as the first embodiment, the wiring pattern 8 and the cut area CUA where the adjacent three wiring patterns 8 are cut off can be formed.

The second embodiment as mentioned above can achieve the same functions and effects as those of the first embodiment. Further, in processing the first upper layer film, since the lithography process for forming a line and space pattern and the lithography process for forming a cut pattern are separated, to form the cut pattern 5x of the first upper layer film pattern 5, even if the lithography process for directly forming the cut pattern 5x is difficult, the above processing can be performed.

Third Embodiment

FIGS. 14A to 14G depict a third embodiment and hereinafter a description will be made about the portions different from the first embodiment. This embodiment shows an example of forming the first upper layer film pattern 5 shown in FIGS. 4A and 4B, where a pattern 5y is formed with a curved portion because of the features of the lithography around the cut area CUA0 or the processing of the first upper layer film pattern 5.

Figure 14A:
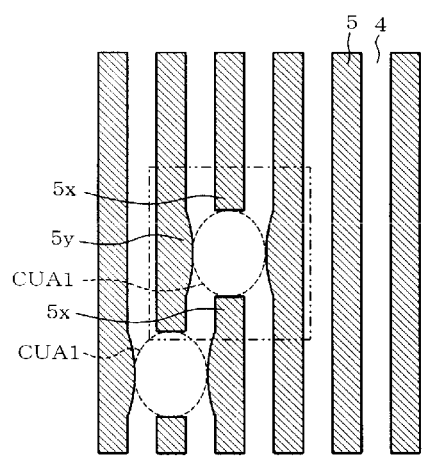
FIGS. 14A to 14G are each an exemplary plan view of the cut areas of wirings in the bit line hookup circuit corresponding to each step of the manufacturing process according to a third embodiment.

FIG. 14A is an example of a view corresponding to the process shown in FIG. 4A. When forming the first upper layer film pattern 5, in a portion corresponding to the cut area CUA0 where a repetition of a line and space pattern is disturbed, there is the case where a wide width pattern 5y in which the first upper layer film pattern 5 on the both sides gets wider because of the features of the lithography or the processing. Therefore, a cut area CUA1 gets narrower than the cut area CUA0 shown in the first embodiment.

Hereinafter, the same process as in the first embodiment will be described based on the first upper layer film pattern 5 shown in FIG. 14A, namely the plane pattern including the cut pattern 5x and the wide width pattern 5y.

Figure 14B:
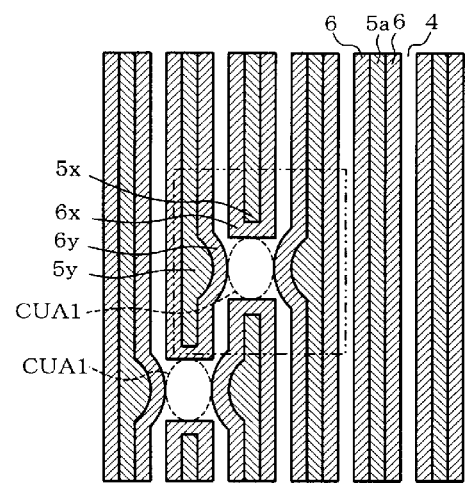

As illustrated in FIG. 14B, the first upper layer film pattern 5 is subjected to the slimming processing to get the second upper layer film pattern 5a, and the first sidewall films 6 are formed on the both sidewalls thereof. Here, a loop first sidewall film 6x is formed around the cut pattern 5x facing the cut area CUA1 in a way of connecting the both sidewalls. Further, after the slimming processing, the wide width pattern 5y facing the cut area CUA1 has a wide portion, the first sidewall film 6 is formed to have a curved portion 6y of the wide width pattern 5y on the sidewall facing the cut area CUA1.

Figure 14C:
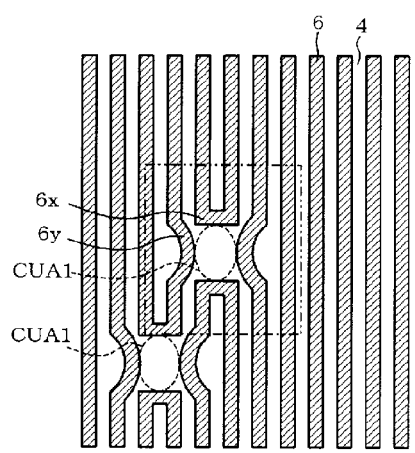
Figure 14D:
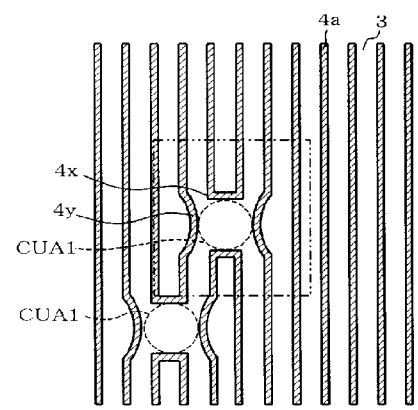

Thereafter, as illustrated in FIG. 14C, the second upper layer film pattern 5a is selectively removed, hence to form a mask for processing the lower layer film 4. Subsequently, as illustrated in FIG. 14D, with the second upper layer film pattern 5a used as the mask, the lower layer film 4 is etched, to form a first lower layer film pattern, and further the first lower layer film pattern is slimmed to form the second lower layer film pattern 4a. In this state, a loop pattern 4x is formed in the portion processed by the loop first sidewall film 6x. Further, the same shape is transferred to the portion where the lower layer film 4 is processed with the curved portion 6y of the first sidewall film 6 used as the mask, where the curved portion 4y is formed in the second lower layer film pattern 4a.

Figure 14E:
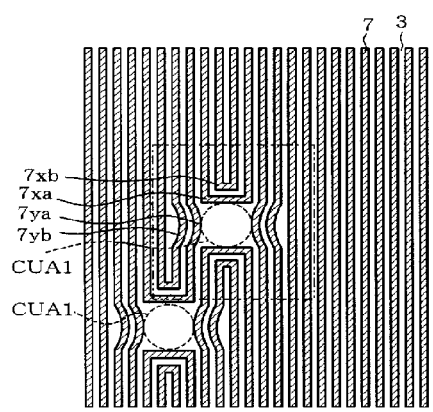

Next, as illustrated in FIG. 14E, second sidewall films 7 are formed on the both sidewalls of the second lower layer film pattern 4a. In this state, loop second sidewall films 7xa and 7xb are respectively formed inside and outside on the both sidewalls of the loop second lower layer film pattern 4x in a connected way from both sides. Further, in the cut area CUA1, curved portions 7ya and 7yb are formed in the second sidewall films 7 to which the same shape is transferred, on the both sidewalls of the curved portion 4y of the second lower layer film pattern 4a.

Thereafter, similarly to the above, the second sidewall films 7 are used as a mask to etch the interlayer insulating film 3 and the concave portions 3a with a predetermined depth are formed on the surface of the interlayer insulating film 3. In this state, since the concave portions 3a are formed in the portion where the second sidewall films 7 are not formed, an outer loop concave portion 3xa and an inner cut pattern concave portion 3xb are formed in the cut area CUA1 in a different region from the loop second sidewall films 7xa and 7xb of the second sidewall film 7, in the same way as shown in FIG. 10A. Further, a wide portion of the cut area CUA1 is also formed as a connected concave portion 3xc. Further, a curved concave portion curved by the curved portions 7ya and 7yb of the second sidewall film 7 facing the cut area CUA1 is formed.

Figure 14F:
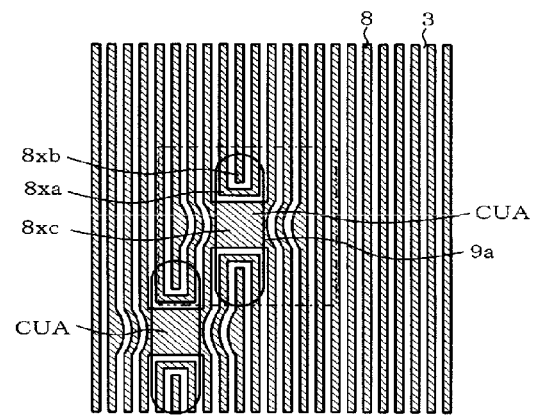

Next, as illustrated in FIG. 14F, the concave portions 3a of the interlayer insulating film 3 formed as mentioned above are embedded with the copper wiring pattern 8 according to the Damascene process. The formation process is as mentioned above: a copper wiring film is formed, left within the concave portions 3a, and the copper wiring on the interlayer insulating film 3 is remove through the polishing process of the CMP.

Since the wiring pattern 8 is formed within the concave portions 3a of the interlayer insulating film 3, a loop wiring pattern 8xa and a cut wiring pattern 8xb are formed in the cut area CUA1 of FIG. 14F. Further, a connected wiring pattern 8xc is formed in the connected concave portion 3xc that is a wide region, in a way of connecting the two wiring patterns 8. Further, curved wiring patterns 8ya and 8yb are formed within the concave portions curved by the curved portions 7ya and 7yb of the second sidewall film 7.

Figure 14G:
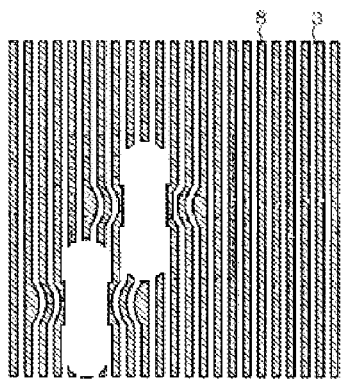

Then, in a state where the above wiring pattern 8 is formed, a resist film 9 for forming a cut area is formed on the top surface as mentioned above, and the openings 9a of the cut areas CUA are patterned correspondingly to the cut areas CUA0, as shown in FIG. 14G. Subsequently, the loop wiring pattern 8xa, the cut wiring pattern 8xb, and the connected wiring pattern 8xc of the wiring pattern 8 exposed to the openings 9a of the resist 9 are removed. According to this, the three adjacent wiring patterns 8 are formed to be cut in the cut area CUA. In this case, the middle wiring pattern 8 of the three wiring patterns 8 is regarded as the bit line BLo or BLe and the wiring patterns 8 on both sides are dummy lines DML.

The third embodiment as mentioned above can achieve the same functions and effects as those of the first embodiment. Further, when the first upper layer film pattern 5 is formed according to the lithography technique, a curved pattern sometimes occurs in the portion facing the cut area CUA1 at a time of forming the cut pattern 5a, and in such a case, the pattern formation according to this embodiment can be used. The wiring pattern as shown in FIG. 14G is a unique shape formed at a time of using the sidewall transfer technique using the mandrel pattern 5 (first upper layer film pattern 5) of the first embodiment twice.

Fourth Embodiment

FIGS. 15 to 22 show a fourth embodiment and hereinafter, a description will be made about the portions different from the first embodiment. In this embodiment, a copper wiring pattern according to the Damascene process is not formed but a conductive film for wiring that may be patterned such as a tungsten film or an aluminum film is previously formed on the interlayer insulating film 3 and processed to form a wiring pattern. This embodiment is different from the first embodiment in that the wiring pattern is formed in a portion inverted from the wiring pattern 8 shown in the first embodiment.

Figure 15A:
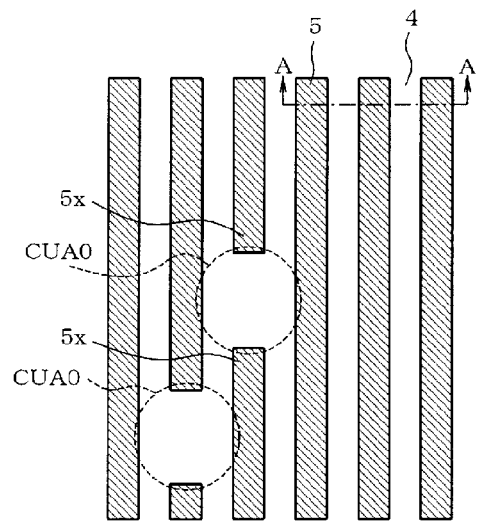
FIG. 15A is an exemplary plan view of the cut areas of wirings in the bit line hookup circuit illustrating one step of the manufacturing process according to a fourth embodiment.
Figure 15B:
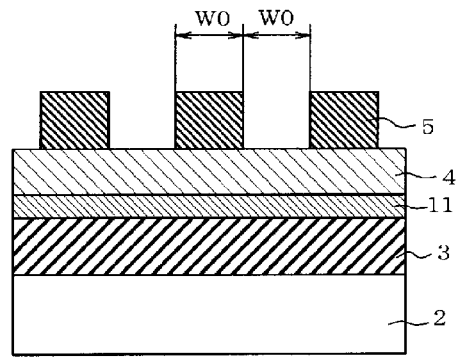
FIG. 15B is an exemplary cross-sectional view of the portion indicated by the line A-A in FIG. 15A (example 1).

FIGS. 15A and 15B are views corresponding to FIGS. 4A and 4B. As illustrated in FIG. 15B, the interlayer insulating film 3 is formed above the silicon substrate 2, and on the top surface, a conductive film 11 for forming a wiring pattern is formed. The conductive film 11 is made of, for example, an aluminum film, a metal film including aluminum, or a material including conductivity, and formed as a film that can be patterned through etching.

The above figures show the state in which the lower layer film 4 and the first upper layer film pattern 5 for forming the wiring pattern is formed on the top surface of the conductive film 11. The lower layer film 4 is made of a material different from that of the conductive film 11 and the film can be selectively etched. Further, the upper layer film of the first upper layer film pattern 5 is made of a material that can be selectively etched on the lower layer film 4.

In FIG. 15A, the first upper layer film pattern 5 includes a line and space pattern formed in the direction of forming a bit line and a cut pattern 5x in which one of the lines is cut off correspondingly to the portion for forming the cut area CUA. The cut area CUA0 is formed there by the cut pattern 5x. FIG. 15B schematically shows the cross-section of the portion indicated by the line A-A in FIG. 15A. In the following FIGS. 16 to 22, B of each figure shows the cross-section of the same portion as in FIG. 15A.

Figure 16A:
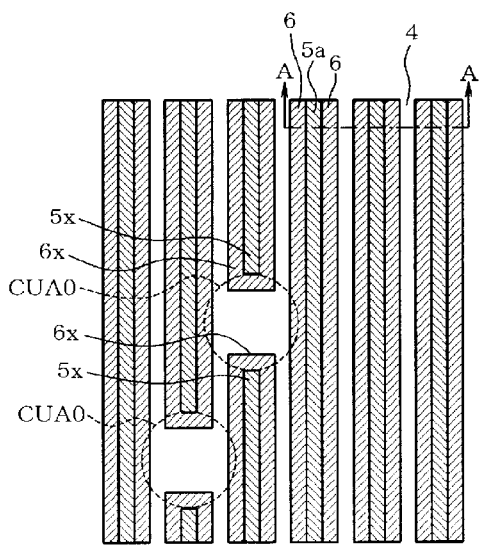
FIG. 16A is an exemplary plan view of the cut areas of wirings in the bit line hookup circuit illustrating one step of the manufacturing process.
Figure 16B:
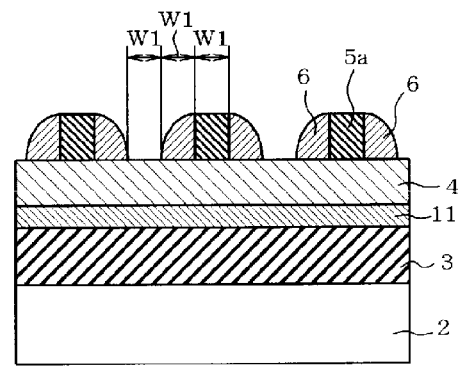
FIG. 16B is an exemplary cross-sectional view of the portion indicated by the line A-A in FIG. 16A (example 2).

Next, as illustrated in FIGS. 16A and 16B, the second upper layer film pattern 5a is formed through the slimming processing so that the width W0 of the first upper layer film pattern 5 may be about half, W1 (=W0/2). Thereafter, the first sidewall films 6 with a film thickness of W1 are formed on the both sidewalls of the second upper layer film pattern 5a. The first sidewall film 6 is made of a material different from that of the lower layer film 4 and the second upper layer film pattern 5a and the material that can be selectively etched is selected. The first sidewall film 6 may be formed in the same way as in the first embodiment.

In this state, since the first sidewall films 6 are formed in a way of surrounding the second upper layer film pattern 5a, the first sidewall film 6 in the cut area CUA0 of FIG. 5A is formed in a way of surrounding a portion where the second upper layer film pattern 5a is cut off, hence to form a loop first sidewall film 6x connected in a loop shape.

Figure 17A:
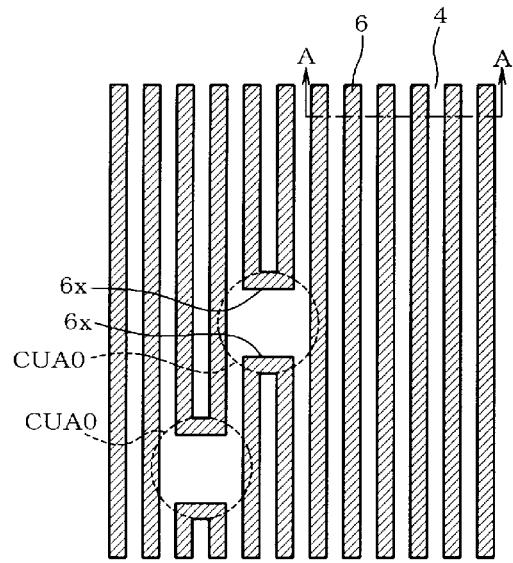
FIG. 17A is an exemplary plan view of the cut areas of wirings in the bit line hookup circuit illustrating one step of the manufacturing process.
Figure 17B:
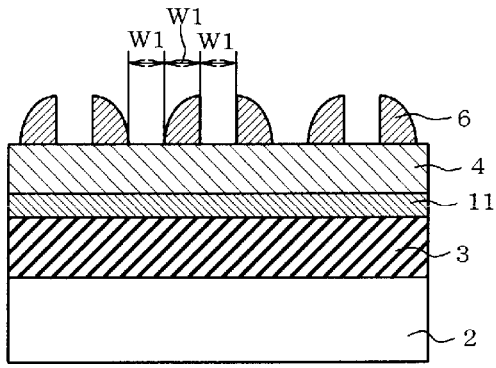
FIG. 17B is an exemplary cross-sectional view of the portion indicated by the line A-A in FIG. 17A (example 3).

Next, as illustrated in FIGS. 17A and 17B, the second upper layer film pattern 5a is selectively removed to form a pattern in which the first sidewall film 6 remains on the lower layer film 4. According to this, the first sidewall films 6 with the width of W1 are aligned on the lower layer film 4 at the pitch of W1.

Figure 18A:
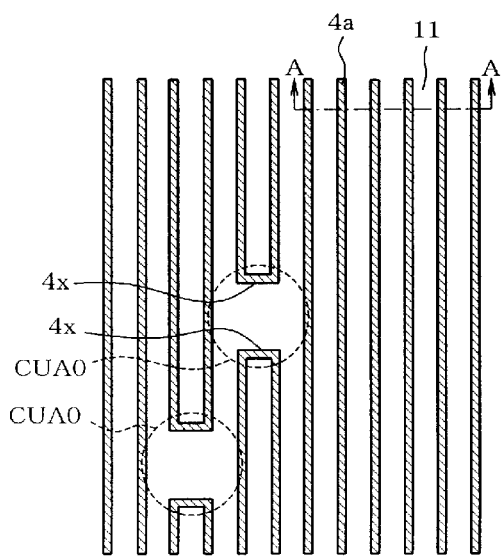
FIG. 18A is an exemplary plan view of the cut areas of wirings in the bit line hookup circuit illustrating one step of the manufacturing process.
Figure 18B:
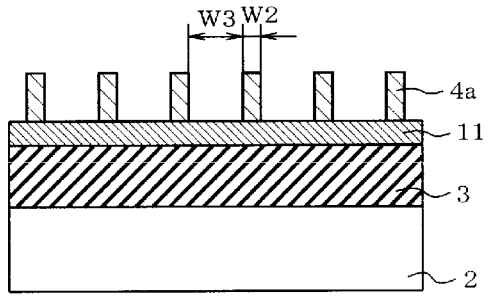
FIG. 18B is an exemplary cross-sectional view of the portion indicated by the line A-A in FIG. 18A (example 4).

Next, as illustrated in FIGS. 18A and 18B, the first sidewall films 6 are used to etch the lower layer film 4, hence to form a first lower layer film pattern. Thereafter, the first sidewall films 6 are removed, hence to form a second lower layer film pattern 4a with the width of W2 (=W1/2=W0/4) by the slimming processing.

Figure 19A:
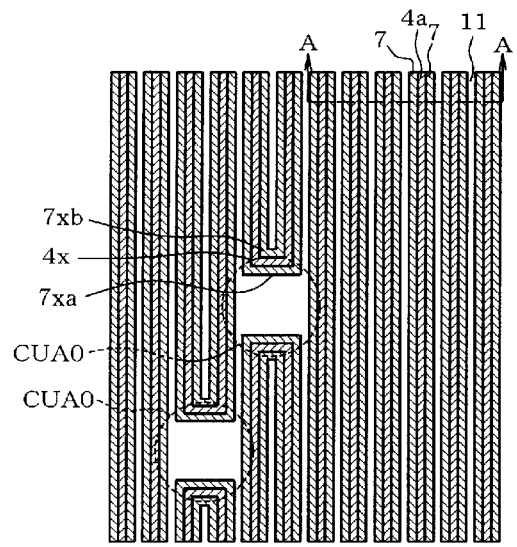
FIG. 19A is an exemplary plan view of the cut areas of wirings in the bit line hookup circuit illustrating one step of the manufacturing process.
Figure 19B:
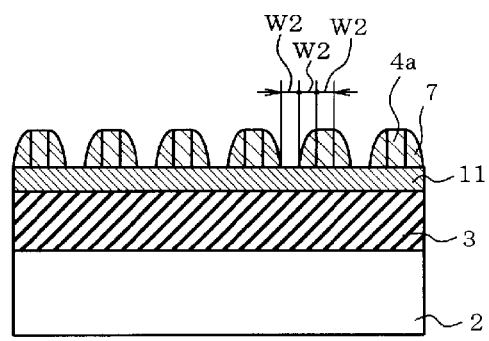
FIG. 19B is an exemplary cross-sectional view of the portion indicated by the line A-A in FIG. 19A (example 5).

Then, as illustrated in FIGS. 19A and 19B, the second sidewall films 7 with the width of W2 are formed on the both sidewalls of the second lower layer film pattern 4a. According to this, the second lower layer film pattern 4a and the second sidewall film 7 are respectively formed with the width of W2 and the space between the second sidewall films 7 also becomes W2. The second sidewall film 7 is made of a material different from that of, for example, the conductive film 11 and the second lower layer film pattern 4a and the material that can be selective etched is selected. The second sidewall film 7 may be formed in the same way as in the first embodiment.

In this state, since the second sidewall films 7 are formed in a way of surrounding the second lower layer film pattern 4a, the second sidewall film 7 in the cut area CUA0 of FIG. 19A is formed along the cut pattern 4x of the second lower layer film pattern 4a, hence to form an outer loop second sidewall film 7xa and an inner loop second sidewall film 7xb connected in a loop shape.

Figure 20A:
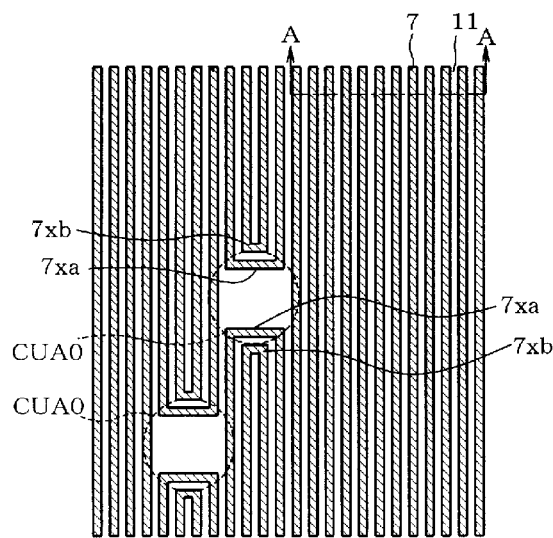
FIG. 20A is an exemplary plan view of the cut areas of wirings in the bit line hookup circuit illustrating one step of the manufacturing process.
Figure 20B:
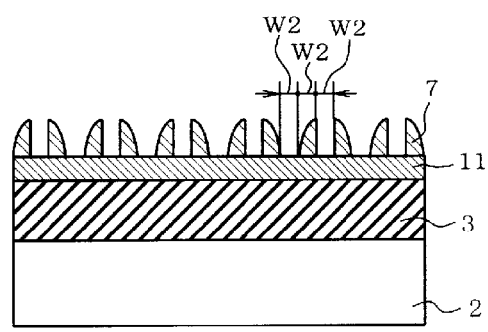
FIG. 20B is an exemplary cross-sectional view of the portion indicated by the line A-A in FIG. 20A (example 6).

Next, as illustrated in FIGS. 20A and 20B, the second lower layer film pattern 4a is selectively removed to form a pattern in which the second sidewall films 7 remain on the interlayer insulating film 3. According to this, the second sidewall films 7 with the width of W2 are aligned at the pitch of W2 on the conductive film 11.

Figure 21A:
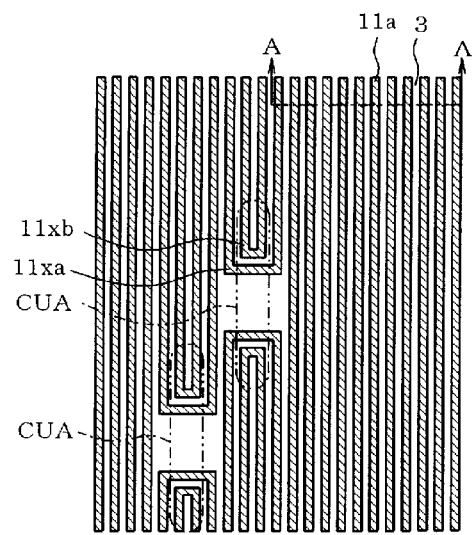
FIG. 21A is an exemplary plan view of the cut areas of wirings in the bit line hookup circuit illustrating one step of the manufacturing process.
Figure 21B:
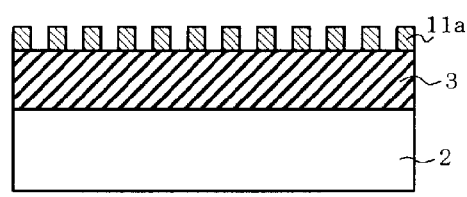
FIG. 21B is an exemplary cross-sectional view of the portion indicated by the line A-A in FIG. 21A (example 7).

Subsequently, as illustrated in FIGS. 21A and 21B, the second sidewall films 7 are used as a mask, to etch the conductive film 11, hence to form a wiring pattern 11a. In this state, since the wiring pattern 11a is formed to remain under each portion where the second sidewall film 7 is formed, loop wiring patterns 11xa and 11xb in the cut area CUA0 of FIG. 21A are formed with the same pattern as that of the loop second sidewall films 7xa and 7xb of the second sidewall film 7. Further, since the conductive film 11 is removed in a wide portion of the cut area CUA0, the top surface of the interlayer insulating film 3 is exposed.

Figure 22A:
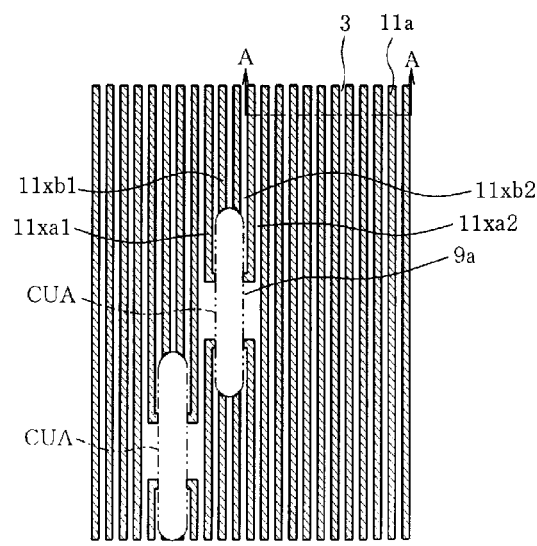
FIG. 22A is an exemplary plan view of the cut areas of wirings in the bit line hookup circuit illustrating one step of the manufacturing process.
Figure 22B:
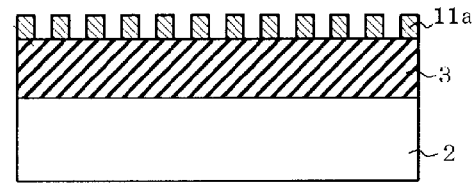
FIG. 22B is an exemplary cross-sectional view of the portion indicated by the line A-A in FIG. 22A (example 8).

Next, as illustrated in FIGS. 22A and 22B, in a state where the wiring pattern 11a is formed as mentioned above, a resist film 9 for forming a cut area is formed on the top surface and according to the photolithography technique, the openings 9a of the cut areas CUA are patterned correspondingly to the cut areas CUA0 in the same way as described above.

Next, the loop wiring patterns 11xa and 11xb of the wiring pattern 11a exposed to the openings 9a of the resist 9 are removed. According to this, four adjacent wiring patterns 11a are cut in the cut area CUA. In this case, one of the two wiring patterns 11a in the middle, among the four wiring patterns 11a, is regarded as the bit line BLo or BLe and the remaining wiring patterns 11a become the dummy lines DML. Further, at least a part of the loop wiring patterns 11xa and 11xb extending in the X direction crossing the Y direction is cut. As a result, an adjustment margin in the X direction can be enlarged.

The above cut areas CUA where four wiring patterns 11a are cut are sequentially formed at a position deviated from each other by the three wiring patterns 11a and at a position deviated in the extending direction of the wiring pattern 11a. According to this, the number of the dummy lines DML is increased by one compared to the wiring pattern of the bit line hookup circuit HU in the structure shown in FIG. 3; however, similarly to the first embodiment, this embodiment has the structure of the minimum number of the wirings to be cut.

According to the fourth embodiment as mentioned above, when the conductive film 11 formed on the interlayer insulating film 3 is processed into the wiring pattern 11a using the sidewall transfer technique twice, the cut area CUA in the bit line hookup circuit HU can be formed by cutting the four adjacent wiring patterns 11a, thereby saving the space.

Although, in the above embodiment, the wiring pattern 11a is formed by processing the conductive film 11 with the second sidewall films 7 used as the mask, an inverted pattern of the pattern of the second sidewall films 7 can be formed as a mask. In this case, the same wiring pattern as the wiring pattern 8 formed through the Damascene process in the first embodiment can be formed. According to this, a cut area CUA in which three wiring patterns are cut may be formed.

Variation Example of Layout

Figure 23:
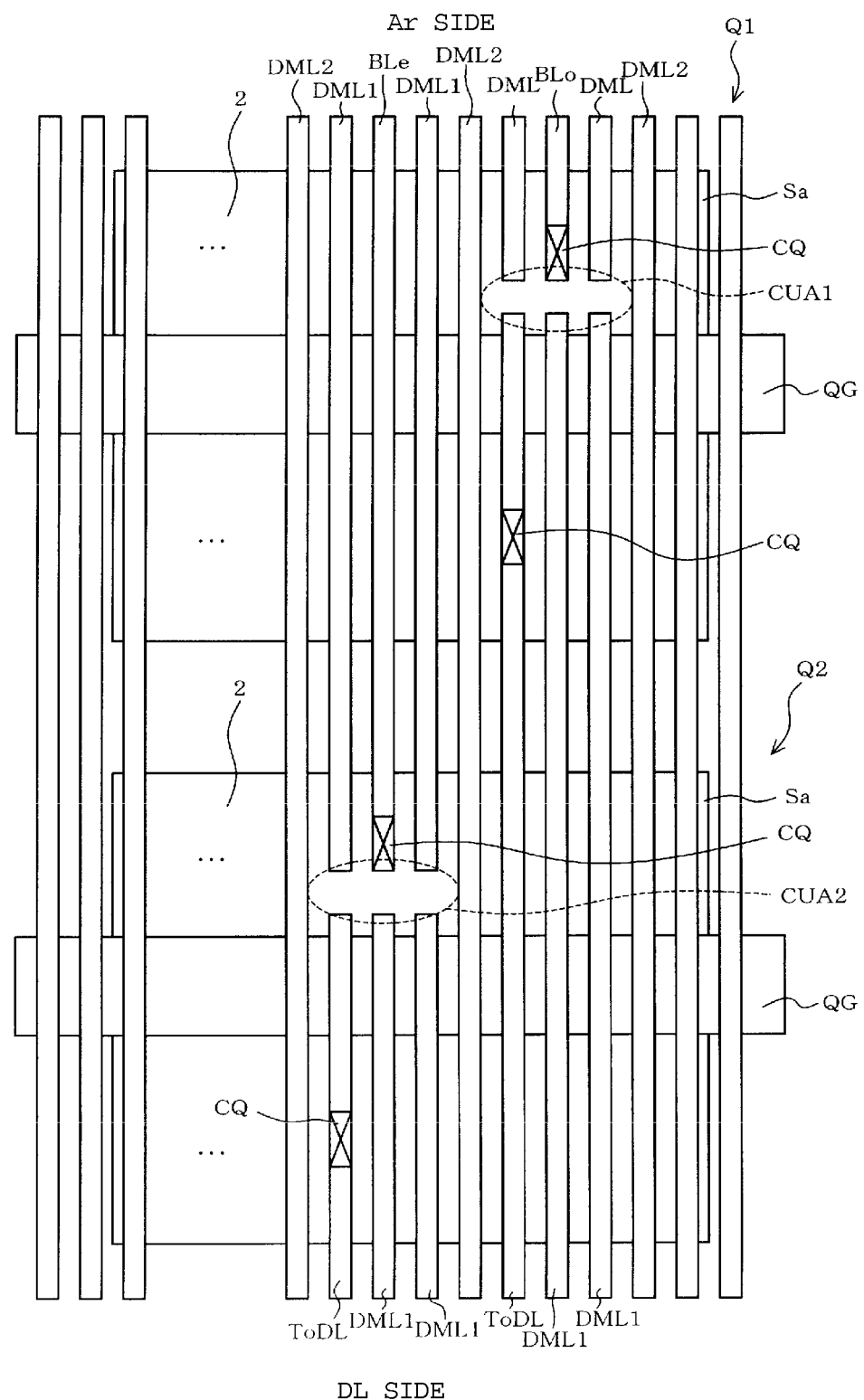
FIG. 23 is another exemplary plan view illustrating cut areas of wirings in the bit line hookup circuit.
Figure 24:
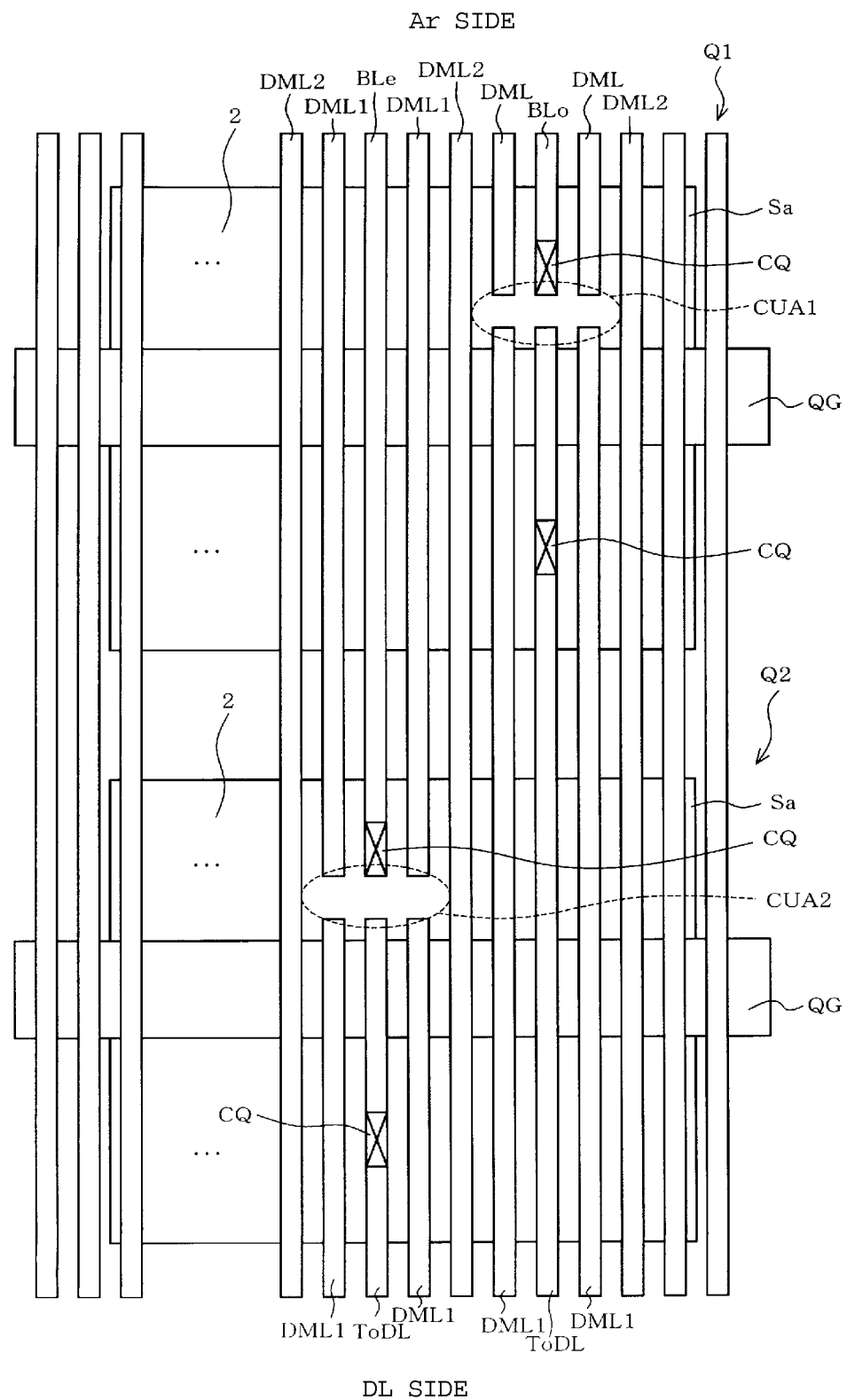
FIG. 24 is further another exemplary plan view illustrating cut areas of wirings in the bit line hookup circuit.

FIGS. 23 and 24 show an example of a layout pattern different from that shown in FIG. 3 in the first embodiment. For example, the layout of the transistors Q1 and Q2 in the bit line hookup circuit HU can be designed as shown in FIG. 23. The interlayer insulating film is formed above the element forming area Sa and gate electrode QG corresponding to each of the transistors Q1 and Q2.

Multiple (for example, 32) wirings are formed in the interlayer insulating film, so that they cross above the gate electrodes QG of the transistors Q1 and Q2. At least three dummy lines DML electrically in a floating state are arranged between the bit lines BLo and BLe. By arranging the dummy lines DML between the bit lines BLo and BLe, a dielectric breakdown voltage between the bit line BLo and the bit line BLe is improved. The bit line BLo and the wiring ToDL that extends to the data latch circuit DL are connected through the respective contacts CQ to the source and the drain region of the transistor Q1. The bit line BLe and the wiring ToDL that extends to the data latch circuit DL are connected through the respective contacts CQ to the source and the drain region of the transistor Q2.

The bit line BLo connected to the transistor Q1 includes a cut area CUA1 in which three lines including the dummy lines DML positioned on the both sides of the same bit line are cut. The bit line BLo is the middle wiring of the three. Here, one of the wirings (on the side of the data latch circuit DL) cut in the cut area CUA1 is used as the wiring ToDL. In FIG. 23, the wiring on the left of the three wirings is used as the wiring ToDL. As a result, in the cut area CUA1, a distance between the bit line BLo and the wiring ToDL can be enlarged, thereby inhibiting a short between wirings.

Similarly, the bit line BLe connected to the transistor Q2 includes a cut area CUA2 in which three lines including the dummy lines DML positioned on the both sides and the same bit line are cut. The bit line BLo is the middle wiring of the three. Here, one of the wirings (on the side of the data latch circuit DL) cut in the cut area CUA2 is used as the wiring ToDL. In FIG. 23, the wiring on the left of the three wirings is used as the wiring ToDL. As a result, in the cut area CUA2, a distance between the bit line BLo and the wiring ToDL can be enlarged, thereby inhibiting a short between the wirings.

Although a distance between the bit line BLe and the wiring ToDL connected to the transistor Q1 may become short, a problem rarely occurs because a voltage between the bit line BLe and the wiring ToDL connected to the transistor Q1 only becomes large during the erase operation.

This layout can be formed by cut areas CUA0 formed in the mandrel pattern 5, adjacent to each other in the X direction, and having different positions in the Y direction, as illustrated in FIGS. 4A and 4B in the first embodiment. Namely, the cut area CUA1 and the cut area CUA2 are positioned with one dummy line DML2 intervening therebetween in the direction crossing the wiring extending direction. Further, the number of the dummy lines DML between the bit line BLo and the bit line BLe can be lessened, thereby reducing the circuit area.

Further, the layout of the transistors Q1 and Q2 in the bit line hookup circuit HU may be designed as shown in FIG. 24. In an application example in FIG. 24, although one of the wirings (on the side of the data latch circuit DL) cut in the cut area CUA1 is used as the wiring ToDL, the middle one of the three wirings is used as the wiring ToDL. Similarly, although one of the wirings (on the side of the data latch circuit DL) cut in the cut area CUA2 is used as the wiring ToDL, the middle one of the three wirings is used as the wiring ToDL. As a result, a distance between the bit line BLe and the wiring ToDL connected to the transistor Q1 can be enlarged.

Other Embodiment

In addition to the embodiments described above, the following variation can be made.

As for the size of each pattern, although the example with a relation among the widths W0, W1, and W2 set has been described, a relation among these sizes is not to be strictly defined but it can be roughly set or set in a different relation.

Although the above description has been made in the case of forming a wiring pattern using the sidewall transfer technique twice, the sidewall transfer technique may be used three times; in this case, effect of saving a space can be further achieved.

Although the disclosure is applied to the NAND type flash memory 1, it can be applied to a general semiconductor device designed to have a line and space wiring pattern and a portion of cutting several wirings.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a wiring pattern that includes a plurality of parallel conductive lines that are spaced apart from one another in a first direction and extend in a second direction transverse to the first direction,
wherein the parallel conductive lines includes first and second lines that are adjacent, a third line that is adjacent to the second line, the first and third lines each having a cut portion at different points along the second direction, fourth and fifth lines adjacent to the third line, each having a cut portion that is substantially aligned in the second direction with the cut portion of the third line, and sixth and seventh lines adjacent to the first line, each having a cut portion that is substantially aligned in the second direction with the cut portion of the first line.

2. The semiconductor device according to claim 1, wherein the parallel conductive lines are evenly spaced.

3. The semiconductor device according to claim 1, wherein the second line is continuous in the second direction between the point of the cut portion of the first line and the point of the cut portion of the third line.

4. The semiconductor device according to claim 1, wherein the second line has a first curved portion near the cut portion of the first line and a second curved portion near the cut portion of the third line.

5. The semiconductor device according to claim 4, wherein the first line has a curved portion that is bent toward the cut portion of the third line, and the third line has curved portion that is bent toward the cut portion of the first line.

6. The semiconductor device according to claim 5, wherein the sixth line has a wider width portion adjacent the curved portion of the first line, and the fourth line has a wider width portion adjacent the curved portion of the third line.

7. The semiconductor device according to claim 1, wherein each of the fourth and sixth lines is connected to a transistor and two lines on both sides thereof are not connected to a fixed potential.

8. A semiconductor device comprising:
a wiring pattern that includes a plurality of parallel conductive lines that are spaced apart from one another in a first direction and extend in a second direction crossing the first direction,
wherein the parallel conductive lines include a first cut portion that separate a first group of three adjacent lines and a second cut portion that separate a second group of three adjacent lines, the first cut portion and the second cut portion being located at different points along the second direction.

9. The semiconductor device according to claim 8, wherein the parallel conductive lines are evenly spaced.

10. The semiconductor device according to claim 9, wherein the first group of four adjacent lines is adjacent to the second group of four adjacent lines such that no line is interposed between the two groups.

11. The semiconductor device according to claim 10, wherein one of the two middle lines in each of the first and second groups is connected to a transistor and the remaining three lines are not connected to a fixed potential.

12. A semiconductor device comprising:
a wiring pattern that includes a plurality of parallel conductive lines that are spaced apart from one another in a first direction and extend in a second direction transverse to the first direction,
wherein the parallel conductive lines includes first and second lines that are adjacent, and a third line that is adjacent to the second line, the first and third lines each having a cut portion at different points along the second direction, and
the second line is continuous in the second direction between the point of the cut portion of the first line and the point of the cut portion of the third line.

13. The semiconductor device according to claim 12, wherein the parallel conductive lines are evenly spaced.

* * * * *